Dec. 10, 1963 F. E. CARUSO 3,114,057
CASCADED DIFFERENTIAL AMPLIFIERS WITH BIASED DIODE
SWITCHES FOR PROVIDING SINGLE OUTPUT
DEPENDENT UPON INPUT AMPLITUDE
Filed Oct. 4, 1961

INVENTOR,
FRANK E. CARUSO.
BY Harry M. Saragovitz
ATTORNEY.

United States Patent Office 3,114,057
Patented Dec. 10, 1963

3,114,057

CASCADED DIFFERENTIAL AMPLIFIERS WITH BIASED DIODE SWITCHES FOR PROVIDING SINGLE OUTPUT DEPENDENT UPON INPUT AMPLITUDE

Frank E. Caruso, Long Branch, N.J., assignor to the United States of America as represented by the Secretary of the Army Filed Oct. 4, 1961, Ser. No. 142,991
4 Claims. (Cl. 307—88.5)
(Granted under Title 35, U.S. Code (1952), sec. 266)

The invention described herein may be manufactured and used by or for the Government for governmental purposes, without the payment of any royalty thereon.

This invention relates to switches and particularly to diode switches. More particularly, this invention relates to multiple, voltage-sensitive, diode switches.

Simple switches are too well known to need discussion, and diode switches, while relatively new, are also well known. These diode switches are normally actuated by control of their D.C. bias level, which holds them in a conducting or in a nonconducting state, to correspondingly effect a superimposed A.C. signal. They may be used singly or in multiple units; with each function individually controlled, or with the diodes biased in a series of increasing voltage steps wherein separate functions may be selected to some extent by control of the input, D.C. bias level over a common control circuit.

In the simplest of these series or cascade diode switches, the bias control can select all the circuits associated with the diodes biased above a given level or all those biased below a given level, but it cannot isolate a single diode circuit at a given level.

It is therefore an object of this invention to provide an improved, diode, multiple-switching circuit.

It is a further object of this invention to provide an improved, diode, multiple-switching circuit that is controlled by the D.C. bias level of the applied signal and wherein only a single circuit is actuated at a time.

These and other objects are accomplished by connecting a plurality of differential amplifiers, in a series or cascade network, with a D.C. bias voltage appearing between each successive pair of input terminals, and each of the input terminals connecting through a similarly polarized diode to a common input. A controllable, D.C., input, bias voltage is applied, along with the useful A.C. signal, to this common input.

All the diodes connected to input terminals that are biased below the D.C., input, bias voltage level will be conducting, and all the diodes connected to input terminals that are biased above the D.C., input, bias voltage level will be cut-off.

When the D.C., input, bias voltage level is between the D.C. bias levels of the input terminals of any one of the differential amplifiers, only one terminal will conduct, and that amplifier will produce an A.C. output. At the same time, both input terminals of all of the other amplifiers will be either conducting or cut-off. In either case, there will be no differential voltage applied across any of the other pairs of input terminals and none of the other amplifiers will produce an output.

Figure 1:
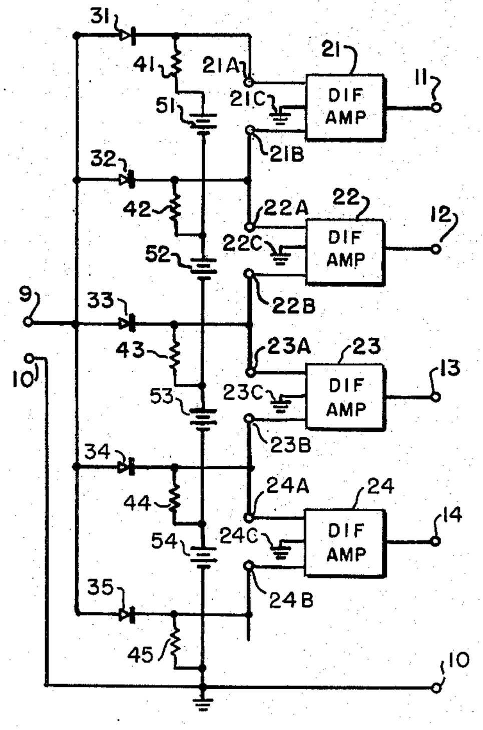
Figure 2:
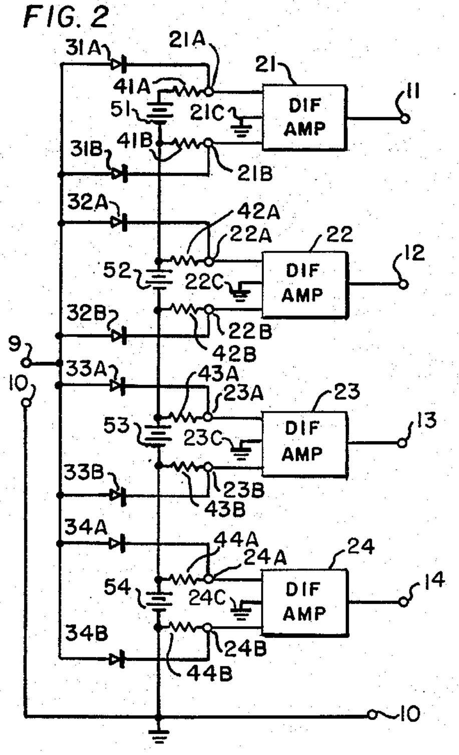
Figure 3:
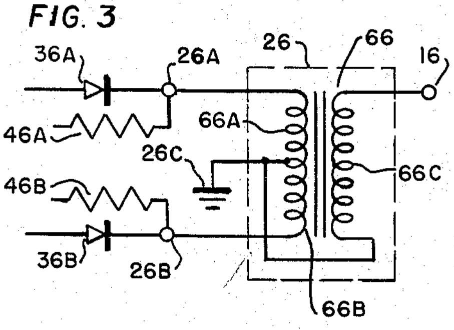
Figure 4:
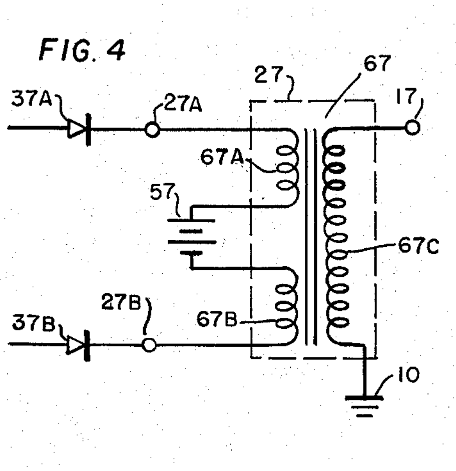

This invention will be better understood, and other and further objects of this invention will become apparent from the following specification and the drawings of which:

FIGURES 1 and 2 show block diagrams of circuits connected according to this invention, and FIGURES 3 and 4 show circuit diagrams of typical differential transformer networks that may be used with this invention.

Referring now more particularly to FIGURE 1, the terminals 9 and 10 are for the connection of a source of input signals and D.C. control bias. The terminal 10 is connected to the common ground.

The differential amplifiers are 21, 22, 23, and 24. Each differential amplifier has two input terminals which have the number of the differential amplifier and the letter A or B. Each differential amplifier has its output between the common ground and one of the terminals 11 through 14.

The input terminals of the differential amplifiers are connected to the common terminal 9 through the diodes 31 to 35, with certain of the diodes serving input terminals common to two amplifiers, in the species of FIGURE 1.

The input terminals are also connected to the sources of bias voltage 51 to 54, through the resistors 41 to 45, respectively, with the input terminals that share a common diode also sharing a common resistor, in the species of FIGURE 1.

The inputs to the differential amplifiers 21 to 24 are also provided with a center tap connected to ground. The center taps have the number of the corresponding differential amplifier and the letter C.

In operation, an alternating current input signal is applied to terminals 9 and 10 along with a suitable direct current control bias that has a voltage level within the range of the bias voltages 51 through 54. This control bias level will fall between the bias levels of the input terminals of one of the pairs. The diode connected to the lower input terminal B of this one pair and all the diodes below it, will present a low impedance between the terminals 9 and 10 and will be conducting. The diode connected to the upper input terminal A of this pair, and all the diodes above it will present a high impedance between the terminals 9 and 10 and will be nonconducting.

The alternating current input signals will, thereby, reach terminal B of this one pair, and all those terminals below it, but will not reach terminal A of this pair, nor any of the terminals above it. Since the input signal reaches only one of the input terminals of this pair, a differential signal is applied to the corresponding differential amplifier, which will then produce an output at the appropriate one of the terminals 11 to 14.

The other of the pairs of input terminals of the other differential amplifiers will be either both conducting or both nonconducting, depending on whether the control bias level is above or below the bias level of the appropriate input terminals. Consequently, the respective differential amplifiers will either have signals on both of the input terminals or no signals on either of the input terminals, and will, in either case, not produce any output.

Referring now more particularly to FIGURE 2, another species is seen wherein the differential amplifiers are decoupled by extra resistors, rather than having the input terminals of adjacent amplifiers connected together. In this species, additional diodes and resistors are necessary to accommodate the individual input terminals. For example, the diodes 31A and 31B are provided, connecting to the resistors 41A and 41B and to the terminals 21A and 21B respectively of the amplifier 21. The other diodes provided are connected to the other resistances and input terminals, which are all similarly numbered.

The other elements of the circuit of FIGURE 2 are the same as those seen in FIGURE 1 and have the same numbers.

The operation of this circuit is the same as that of the circuit of FIGURE 1, with that one differential amplifier, whose bias range includes the bias level of the input, having a differential signal across its input terminals and producing an output, and all of the other amplifiers producing no output.

FIGURE 3 shows one of the many possible differential transformer networks that are suitable for use in the circuits of FIGURE 1 or 2, although the connections suitable for FIGURE 2 are actually used. In the network 26 the two input terminals 26A and 26B are connected to the opposite ends of the primary winding of a transformer 66. The primary winding is in two portions 66A and 66B with a center tap connected to the grounded center tap connection 26C of the network.

The secondary winding 66C of the transformer connects to the output terminal 16 of the network and to the common ground, which in this case is a connection back to the center tap of the primary winding. The resistors and source of bias voltage are the same as in FIGURE 2.

It can easily be seen from these connections that, if identical signals are applied, in phase, to the two input terminals 26A and 26B, the signals will cancel each other in the primary winding of the transformer, and there will be no output signal. It is obvious that if no signals are applied, there will also be no output.

However, if the D.C. bias on the diodes 36A and 36B connecting to the input terminals 26A and 26B is such that only one of the diodes is conducting, and the signal is applied to only one of the inputs, that signal will be transmitted through the transformer 66 to the output 16.

FIGURE 4 shows another type of differential transformer network 27 wherein the source of bias voltage 57 is applied across the input terminals 27A and 27B from the ends of the primary windings 67A and 67B that are grounded with respect to alternating current. This species of differential transformer network does not require resistive or other decoupling devices, such as those shown as 41 to 46, but it does require separate primary windings.

In this network, the input connections 27A and 27B to the diodes 37A and 37B are the same as those of the other circuits except for the lack of decoupling elements and grounded center tap. The connections of the secondary winding 67C are the same, and the function of this network is identical to that of the differential transformer network of FIGURE 3.

It should be noted that, in the networks of FIGURES 3 and 4, or in any differential networks of the transformer type, the primary windings must be of such a number and direction of turns that they will cancel each other when the A.C. input signals are applied to both of the input terminals.

The differential transformers of FIGURES 3 and 4 are applicable to the circuit of FIGURE 2 and they can be applied to the circuit of FIGURE 1 when the appropriate input terminals of the adjacent differential transformers are connected together to avoid the necessity of the extra diode.

It will be obvious that additional differential amplifiers can be added to the series of either of FIGURE 1 or 2, and that other types of amplifiers that can perform this type of differential amplification can be used in place of the networks shown in FIGURES 3 and 4. The other types of amplifiers include those having tubes or transistors for additional power or voltage amplification or decoupling.

Coils may be used in place of the resistors shown in FIGURES 1, 2, and 3, since the purpose of the resistors is to decouple the inputs from the source of bias and it is well known that inductive coils are equally suitable for this purpose.

It is also obvious that a single, high-voltage source of bias can be used with voltage dividers in the form of resistors or other voltage dropping elements in place of the individual sources of bias voltage 51–57. Such a single, high-voltage source of bias can also supply the control bias, through a variable potentiometer or other means, if a local selection of the control bias is to be used. Remote selection of the control bias is practical within the limits set by the resistance of the connecting lines and the circuit elements, and the tolerance in control bias voltage allowed by the bias voltage difference between the terminals of each of the pairs of inputs.

In a typical circuit according to this invention IN1415 diodes made by the Western Electric Corporation are used with resistances 41 to 46 of 100 ohms and bias voltages 51 to 57 of 3 volts. The ratio of the transformer windings 66A and B to 66C is one to one.

What is claimed is:

1. In combination with a source of input signals having an alternating current component and a controllable direct current component with respect to ground, a plurality of differential amplifiers, each having a pair of input terminals and a pair of output terminals, said input terminals being connected in series with respect to ground; a source of bias voltage connected between each of said pairs of input terminals; and a plurality of diodes, the terminal of one polarity of each of said diodes being connected to a corresponding one of said input terminals, the terminals of the other polarity of all of said diodes being connected together and to said source of input signals, whereby the differential amplifier whose source of bias voltage includes the level of said direct current component has a differential alternating current component applied across its pair of input terminals and a corresponding output.

2. In combination with a common source of input signals having an alternating current component and a controllable direct current component with respect to ground, a plurality of differential amplifiers, each having a pair of input terminals and a pair of output terminals, said input terminals being connected in series with respect to ground; a source of bias voltage associated with each of said differential amplifiers; means for connecting each one of said sources of bias voltage across said pair of input terminals of one of said differential amplifiers; and a plurality of diodes, the terminal of one polarity of each of said diodes being connected to a corresponding one of said input terminals, the terminals of the other polarity of all of said diodes being connected together and to said source of input signals, whereby the differential amplifier whose source of bias voltage includes the level of said direct current component has a differential alternating current component applied across its pair of input terminals and a corresponding output.

3. In combination with a source of input signals having an alternating current component and a controllable direct current component, a plurality of differential amplifiers, each having a pair of input terminals and a pair of output terminals; a plurality of sources of bias voltage connected in series; means for connecting each one of said sources of bias voltage across said pair of input terminals of one of said differential amplifiers; and a plurality of diodes, each of said diodes having a terminal of one polarity connected to one of said input terminals, and all of said diodes having a terminal of the other polarity connected together to said source of input signals, whereby the differential amplifier whose source of bias voltage includes the level of said direct current component has a differential alternating current component applied across its pair of input terminals, and a corresponding output.

4. In combination with a source of input signals having an alternating current component and a controllable direct current component applied to a common terminal with respect to ground, a plurality of differential amplifiers, each having a first and a second input terminal, a center tap therefor connected to ground, and a first and a second output terminal; a source of bias voltage associated with each of said differential amplifiers, said sources of bias connected in series; resistive means for connecting each successive voltage level, of said series-connected sources of bias voltage, across said first and second input terminals of the associated one of said differential amplifiers; and diode means for connecting each one of said input terminals to said source of input signals, said diode means all having the same polarity with respect to said source of input terminals.

References Cited in the file of this patent

UNITED STATES PATENTS

| | | |
|---|---|---|
| 2,556,200 | Lesti | June 12, 1951 |
| 3,041,469 | Ross | June 26, 1962 |
| 3,050,713 | Harmon | Aug. 21, 1962 |